United States Patent
Lee et al.

(10) Patent No.: US 11,770,271 B2
(45) Date of Patent: Sep. 26, 2023

(54) DATA CENTER

(71) Applicant: SAMSUNG ELECTRONICS CO., LTD., Suwon-si (KR)

(72) Inventors: Suk Kyu Lee, Seoul (KR); Dae-In Kang, Seongnam-si (KR); Woong Hee Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/313,225

(22) Filed: May 6, 2021

(65) Prior Publication Data

US 2022/0060354 A1 Feb. 24, 2022

(30) Foreign Application Priority Data

Aug. 21, 2020 (KR) .................. 10-2020-0105266
Nov. 11, 2020 (KR) .................. 10-2020-0150259

(51) Int. Cl.
*H04L 12/44* (2006.01)
*H04L 12/54* (2022.01)
*H05K 7/14* (2006.01)
*H04L 67/1097* (2022.01)

(52) U.S. Cl.
CPC .............. *H04L 12/44* (2013.01); *H04L 12/56* (2013.01); *H04L 67/1097* (2013.01); *H05K 7/1498* (2013.01); *H04L 2012/445* (2013.01)

(58) Field of Classification Search
None
See application file for complete search history.

(56) References Cited

U.S. PATENT DOCUMENTS

| | | |
|---|---|---|
| 6,639,910 B1 | 10/2003 | Provencher et al. |
| 9,645,902 B2 | 5/2017 | Breakstone et al. |
| 10,275,180 B2 | 4/2019 | Ballapuram et al. |
| 10,459,665 B2 | 10/2019 | Olarig et al. |
| 10,521,378 B2 | 12/2019 | Fischer et al. |
| 10,649,940 B2 | 5/2020 | Olarig et al. |
| 2017/0249080 A1* | 8/2017 | Bonnet .............. G06F 3/0659 |
| 2017/0264529 A1* | 9/2017 | Jain .................. H04L 45/04 |
| 2018/0006928 A1* | 1/2018 | Luo .................. H04L 41/122 |
| 2018/0239540 A1 | 8/2018 | Kachare et al. |
| 2019/0163665 A1 | 5/2019 | Kachare et al. |
| 2019/0266274 A1* | 8/2019 | Olarig ............... G06F 3/0679 |

(Continued)

OTHER PUBLICATIONS

TOSS: Traffic-aware distributed object-based storage using software-defined networks, Kanagavelu et al. International Conference on Service Operations and Logistics, and Informatics (2018).*

(Continued)

*Primary Examiner* — Mohamed Ibrahim
(74) *Attorney, Agent, or Firm* — Lee IP Law, P.C.

(57) ABSTRACT

A data center includes: a server including a control plane; a data plane that is configured to receive network connection information from the control plane; and a storage group including a plurality of first storage devices. The data plane may be configured to set connections between the server and the plurality of first storage devices based on the network connection information corresponding to each first storage device of the plurality of first storage devices.

19 Claims, 8 Drawing Sheets

(56) References Cited

U.S. PATENT DOCUMENTS

2021/0311760 A1* 10/2021 Oki ..................... H04L 47/825

OTHER PUBLICATIONS

R. Kanagavelu et al.—"TOSS: Traffic-aware distributed object-based storage using software-defined networks", IEEE Inter. Conference., Jul. 31, 2018, pp. 131-136.
European Office action dated Feb. 4, 2022 and Search Report dated Jan. 24, 2022.

* cited by examiner

DATA CENTER

CROSS-REFERENCE TO RELATED APPLICATION

Korean Patent Application No. 10-2020-0105266, filed on Aug. 21, 2020 and No. 10-2020-0150259, filed on Nov. 11, 2020 in the Korean Intellectual Property Office, and both entitled: "Data Center," are incorporated by reference herein in their entirety.

BACKGROUND

1. Field

Embodiments relate to a data center.

2. Description of the Related Art

A data center, which is a facility that collects various data and provides services, may be a system for operating search engines and databases or may be a computing system for use in companies and organizations.

SUMMARY

Embodiments are directed to a data center, including: a server including a control plane; a data plane that is configured to receive network connection information from the control plane; and a storage group including a plurality of first storage devices. The data plane may be configured to set connections between the server and the plurality of first storage devices based on the network connection information corresponding to each first storage device of the plurality of first storage devices.

Embodiments are also directed to a data center, including: a first storage device including a control plane that is configured to set network connection information; a plurality of storage groups, each including a plurality of second storage devices; and a first data plane that is configured to adaptively set a network connection for each of the second storage devices by receiving the network connection information.

Embodiments are also directed to a data center, including: a first device including a control plane that is configured to set network connection information; a second device including a data plane that is configured to selectively forward data in accordance with the network connection information; and a storage group including a plurality of storage devices configured to transmit or receive data in accordance with the forwarding of data by the second device.

BRIEF DESCRIPTION OF THE DRAWINGS

Features will become apparent to those of skill in the art by describing in detail example embodiments with reference to the attached drawings in which:

FIGS. 4 through 9 are block diagrams of data centers according to some example embodiments.

DETAILED DESCRIPTION

Software-defined networking (SDN) is technology that controls the operation of networks via software in network providing physical connections. OpenDaylight or OpenFlow is one of the interface standard techniques of SDN.

An SDN-based network is divided into a data plane (which consists of hardware) and a control plane (which consists of software). An OpenFlow or OpenDaylight switch enables centralized control of the data plane, allowing a network administrator to manage the network effectively and flexibly via the data plane.

The data plane determines how and via which path data packets are processed and transmitted in the network, and delivers the data packets under the control of the control plane.

A data center that is connected in an SDN manner in an Ethernet-based network will hereinafter be described.

Figure 1:
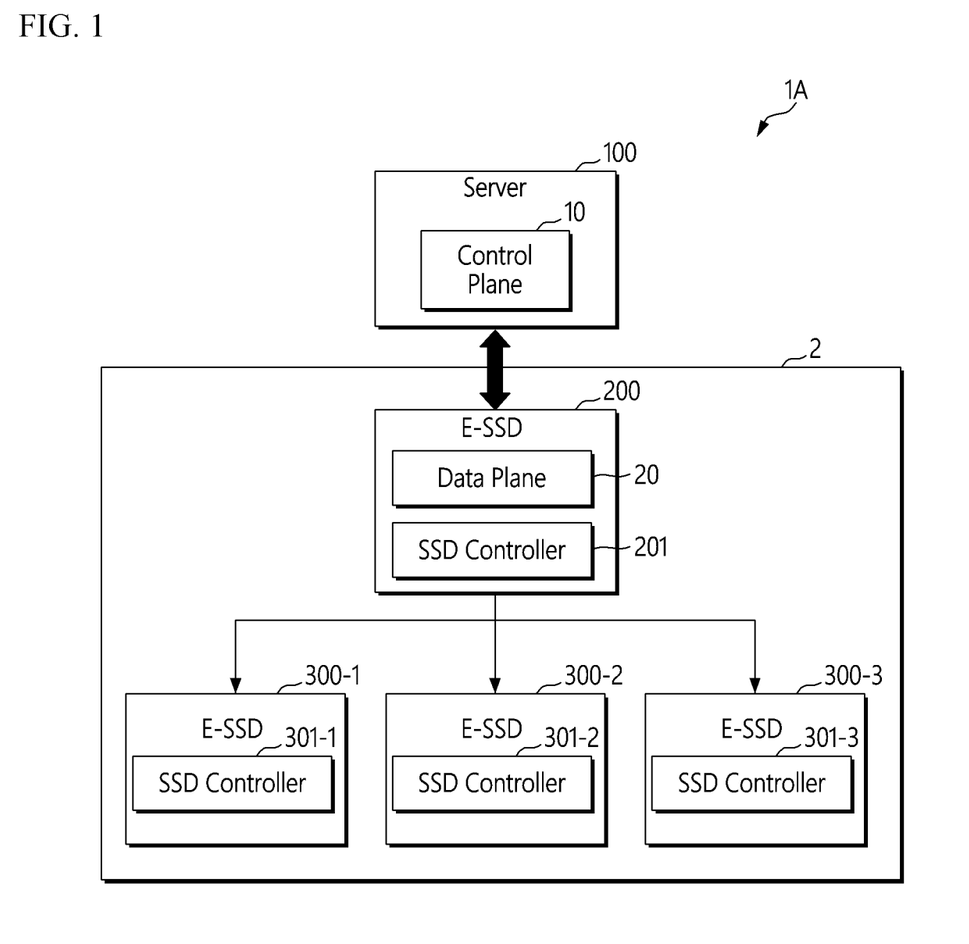
FIG. 1 is a block diagram of a data center according to some example embodiments.

FIG. 1 is a block diagram of a data center according to some example embodiments.

Referring to FIG. 1, a data center 1A may include a server 100 and at least one storage group 2. The data center 1A is illustrated as including one server 100 and one storage group 2, but may actually include a plurality of servers 100 and a plurality of storage groups 2.

The server 100 and the storage group 2 may be connected via a network. The network may be based on, for example, the Ethernet protocol.

The storage group 2 may include a plurality of storage devices 200 and 300-1 through 300-3. The storage group 2 may be implemented as a group of, for example, solid state drives (SSDs).

The server 100, which is a host device, may perform various operations for the data center 1. The server 100 may store data (e.g., at the request of a user or a client) in the storage group 2 via the network. For example, the server 100 may store the data in one of the storage devices 200 and 300-1 through 300-3 of the storage group 2. Also, the server 100 may read data (e.g., at the request of the user or the client) from the storage devices 200 and 300-1 through 300-3 via the network.

The server 100 may include a control plane 10. In the present example embodiment, the control plane 10 manages the flow of data in the storage group 2, which is connected to the control plane 10, and determines a path from a point of departure to a point of destination of the data. For example, when the server 100 transmits data, the control plane 10 may transmit network connection information to the storage group 2 together with the data. The control plane 10 may set the path of the flow of data, and may perform routing and signaling based on the network connection information so that data transmitted via the network can be properly output to any designated physical port.

The network connection information may include, for example, path information, general control information regarding network topology (such as network bandwidth management, restoration, security and policy settings), and device orchestration information.

The storage group 2 may include the storage devices 200 and 300-1 through 300-3, and the storage device 200 may include a data plane 20. In the present example embodiment, the data plane 20 manages the transmission of data to the storage devices 300-1 through 300-3, which are connected to the data plane 20. In response to data being input to an input port, the data plane 20 determines to which output port the data is to be forwarded.

The data plane 20 may include a network flow table. For example, the network flow table may store mapping information between data paths and output ports. The data plane 20 may forward data to an output port corresponding to the path of the data based on the network connection information received from the control plane 10. The data plane 20 may also perform various functions, such as packet modification, Quality of Service (QoS), and filtering, during the transmission of data.

Each of the storage devices 200 and 300-1 through 300-3 may include a storage controller 201 or 301. Although not specifically illustrated, each of the storage devices 200 and 300-1 through 300-3 may further include a nonvolatile memory device connected to the storage controller 201 or 301, e.g., an SSD controller. The storage controller 201 or 301 may control the general operation of the nonvolatile memory device. For example, the storage controller 201 or 301 may control an access operation such as write, read, or delete operations or a background operation associated with the nonvolatile memory device.

Data requested to be stored in, or read from, the server 100 may be stored in, or read from, at least one of the storage devices 300-1 through 300-3 that is connected to an output port designated by the data plane 20, in accordance with a path set by the network connection information from the control plane 10. Thus, the data center 1A may forward data to the storage devices 200 and 300-1 through 300-3 via the data plane 20 in accordance with the network connection information from the control plane 10, which is set in an SDN manner, thereby preventing a network bottleneck and efficiently managing the network.

Figure 2A:
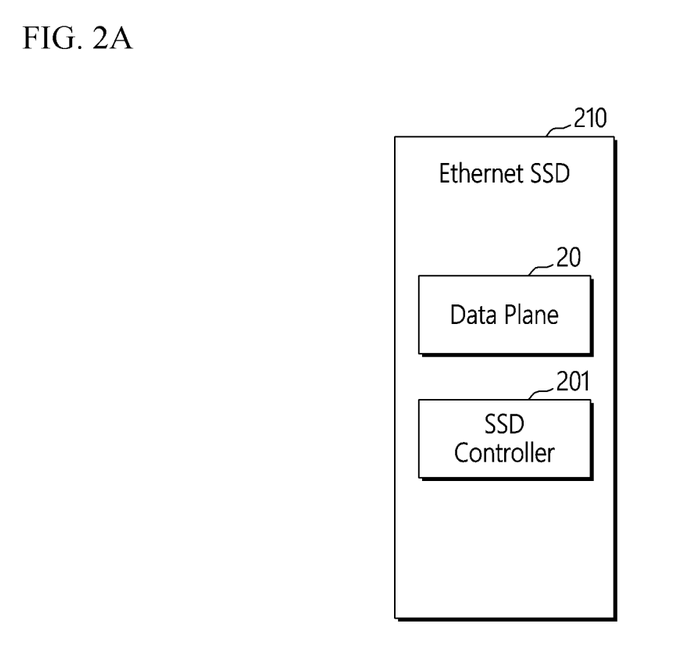
FIGS. 2A through 2C are block diagrams of storage devices according to some example embodiments.
Figure 2B:
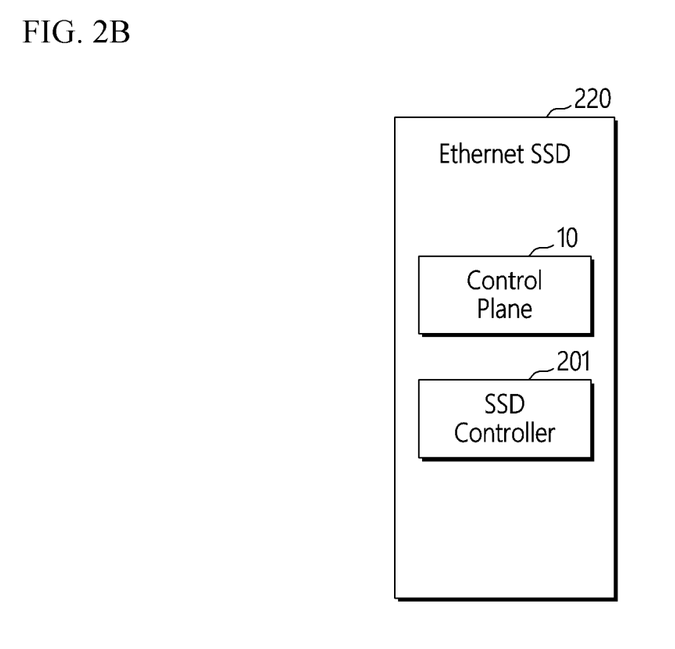
Figure 2C:
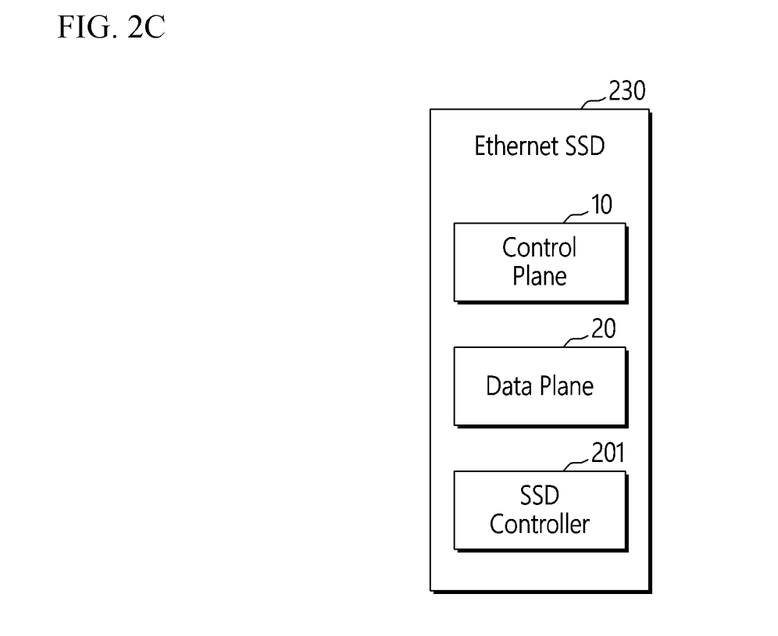

FIGS. 2A through 2C are block diagrams of storage devices according to some example embodiments. For convenience, the embodiments of FIGS. 2A through 2C will hereinafter be described by focusing mainly on the differences with the embodiment of FIG. 1.

Referring to FIG. 2A, a storage device 210 may include a data plane 20 and a storage controller 201. The storage device 210 may control the transmission of data in accordance with the settings of the data plane 20. A nonvolatile memory device (not illustrated) may be further provided in the storage device 210, and thus, the storage device 210 may also operate as a common data storage device.

The data plane 20 may be implemented as a separate element from the storage controller 201 or may be incorporated into the storage controller 201. The storage device 210 may be included in the storage group or may be connected between the server 100 and the storage group 2. The storage device 210 may be connected to, and forward data to, common storage devices not including the data plane 20, i.e., the storage devices 300-1 through 300-3 of FIG. 1, in accordance with network connection information.

Referring to FIG. 2B, a storage device 220 may include a control plane 10 and a storage controller 201. The storage device 220 may orchestrate, manage, and control a device that a data plane belongs to, in accordance with the settings of the control plane 10. A nonvolatile memory device (not illustrated) may be further provided in the storage device 220, and thus, the storage device 220 may also operate as a common data storage device.

The control plane 10 may generate network connection information for processing data in accordance with a request from a user. The storage device 220 may be a host device such as a server or may be a medium disposed and connected between the server 100 and the storage group 2. The control plane 10 may selectively distribute, to a data plane connected thereto, network connection information corresponding to the data plane.

Referring to FIG. 2C, a storage device 230 may include a control plane 10, a data plane 20, and a storage controller 201. A nonvolatile memory device (not illustrated) may be further provided in the storage device 230, and thus, the storage device 230 may also operate as a common data storage device.

The storage device 230 may be a host device such as a server or may be a medium disposed and connected between the server 100 and the storage group 2.

Figure 3A:
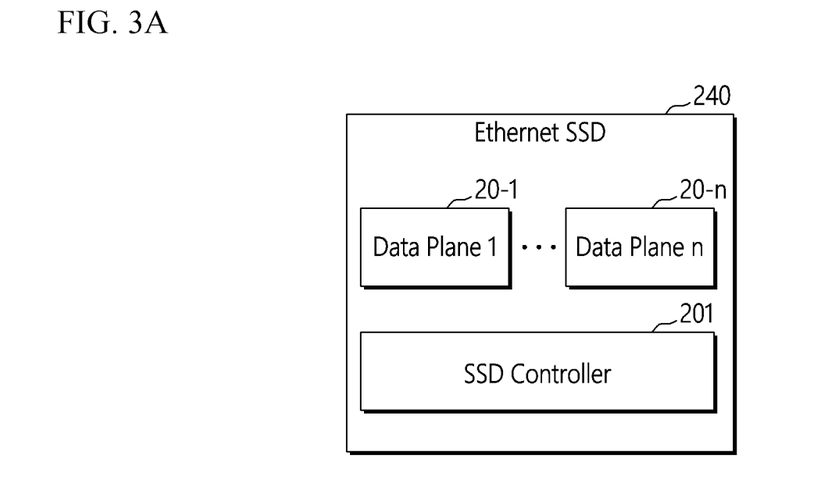
FIGS. 3A and 3B are block diagrams of storage devices according to some example embodiments.
Figure 3B:
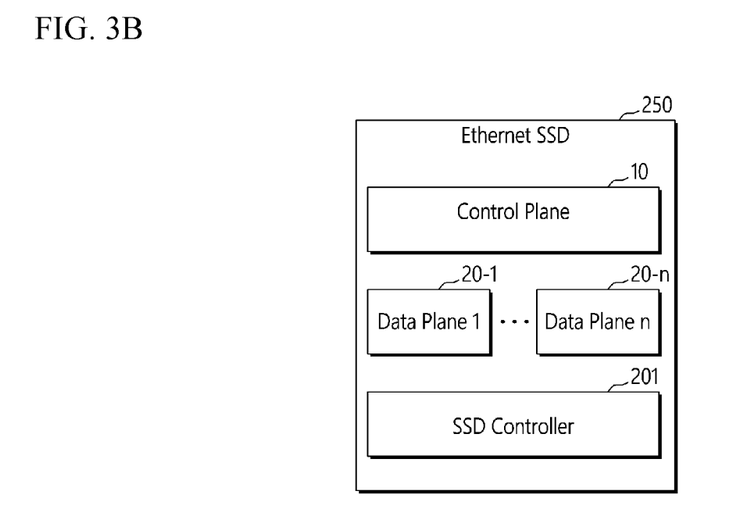

FIGS. 3A and 3B are block diagrams of storage devices according to some example embodiments.

Referring to FIG. 3A, a storage device 240 may include a plurality of data planes 20-1 through 20-n (where n is a natural number) and a storage controller 201. The data planes 20-1 through 20-n may receive network connection information from a control plane (not illustrated) that does not belong to the storage device 240.

Referring to FIG. 3B, a storage device 250 may include a control plane 10, a plurality of data planes 20-1 through 20-n (where n is a natural number) and a storage controller 201. The data planes 20-1 through 20-n may receive network connection information from the control plane 10.

Referring to FIGS. 3A and 3B, the control plane 10 of each of the storage devices 240 and 250 may transmit different network connection information for different data planes, i.e., the data planes 20-1 through 20-n.

In another example embodiment, the control plane 10 of each of the storage devices 240 and 250 may transmit the same network connection information for all the data planes 20-1 through 20-n. In this case, when one of the data planes 20-1 through 20-n, for example, the data plane 20-1, is unable to operate, at least one of the other data planes may replace the data plane 20-1 and forward data based on the network connection information.

It will hereinafter be described how to implement the storage devices of FIGS. 2A through 2C, 3A and 3B on a network.

FIGS. 4 through 9 are block diagrams of data centers according to some example embodiments.

Figure 4:
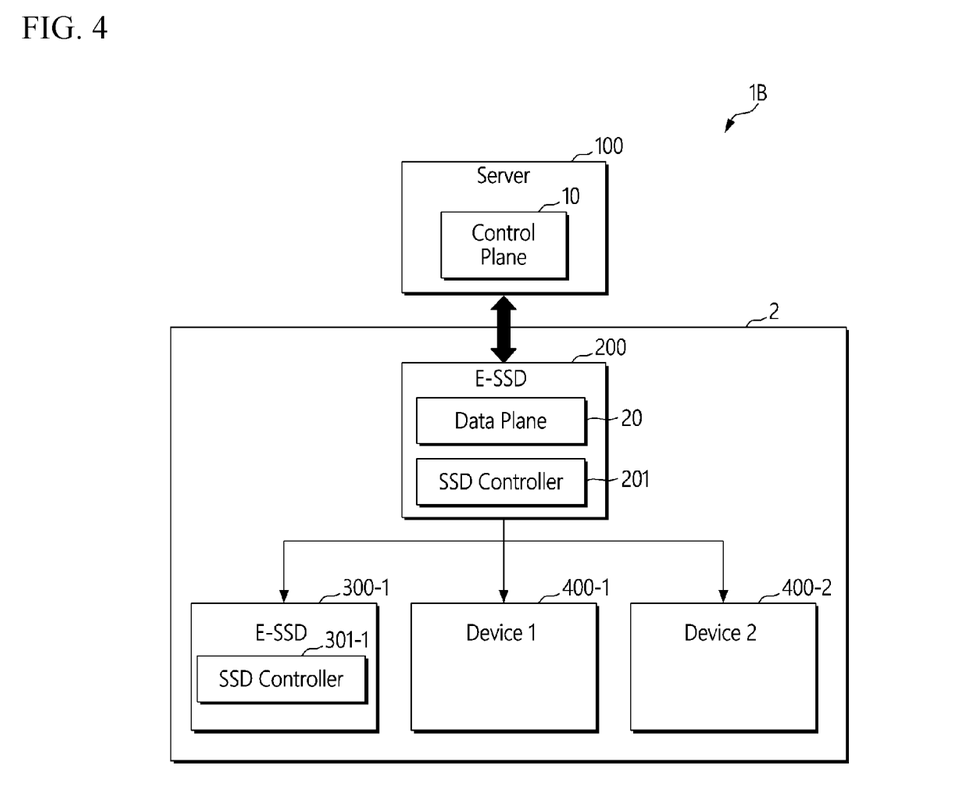

Referring to FIG. 4, a data center 1B may include a server 100 and at least one storage group 2. The server 100 may include a control plane 10. The server 100 may be an application server or may be the storage device 220 of FIG. 2B.

The storage group 2 may include one or more storage devices 200 and 300-1 and one or more electronic devices 400-1 and 400-2. The storage device 200 may be the same as the storage device 200 of FIG. 2A.

The server 100 and the storage device 200 may be connected by a network. The storage devices 200 and 300-1 and the electronic devices 400-1 and 400-2 may be connected by Ethernet. Thus, the storage devices 200 and 300-1 and the electronic devices 400-1 and 400-2 may be connected to one another via an Ethernet interface.

In the storage device 200, a data plane 20 may store data (e.g., at the request of a user) in the storage device 200 or 300-1 or read the data (e.g., at the request of the user) from the storage device 200 or 300-1 based on network connection information, and may forward control commands for the connection control and orchestration of the electronic devices 400-1 and 400-2 based on the network connection information. The electronic devices 400-1 and 400-2 may be Internet-of-Things (IoT) electronic devices that can be controlled via wired or wireless communication.

Figure 5:
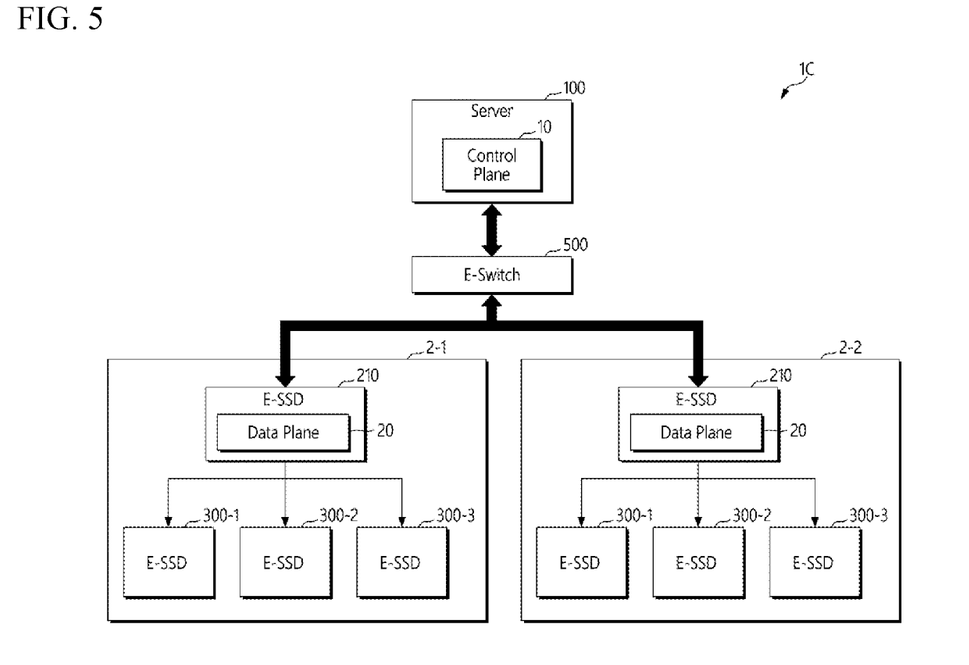

Referring to FIG. 5, a data center 1C may include a server 100, an Ethernet switch ("E-Switch") 500, and a plurality of storage groups 2-1 and 2-2.

The Ethernet switch 500 may be a TOR (Top of Rack) switch capable of managing a large network. The Ethernet switch 500 may connect the server 100 and the storage groups 2-1 and 2-2. The Ethernet switch 500 may selectively distribute network connection information corresponding to a data plane 20 to the data plane 20. In this case, the network connection information may include switching control information for the Ethernet switch 500.

Each of the storage groups 2-1 and 2-2 may include a plurality of storage devices 210 and 300-1 through 300-3. The storage device 210, like its counterpart of FIG. 2A, may include a data plane 20 and may thus forward data to the other storage devices 300-1 through 300-3 in accordance with network connection information.

Figure 6:
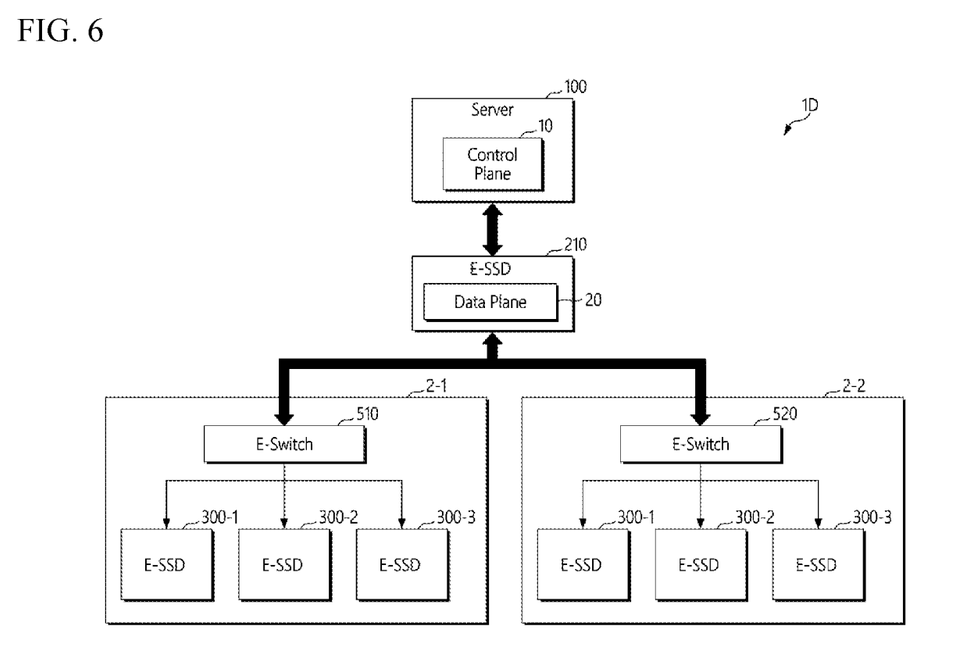

Referring to FIG. 6, a data center 1D may include a server 100, a storage device 210, and a plurality of storage groups 2-1 and 2-2.

The storage device 210 may be disposed between the server 100 and the storage groups 2-1 and 2-2 to connect the server 100 and the storage groups 2-1 and 2-2. The storage device 210, like its counterpart of FIG. 2A, may selectively forward data to at least one of the storage groups 2-1 and 2-2 in accordance with the settings of a data plane 20.

Each of the storage groups 2-1 and 2-2 may include an Ethernet switch 510 or 520 and a plurality of storage devices 300-1 through 300-3. The Ethernet switch 510 or 520 may perform switching in accordance with the settings of the data plane 20 and may thus forward data to the storage devices 300-1 through 300-3.

Figure 7A:
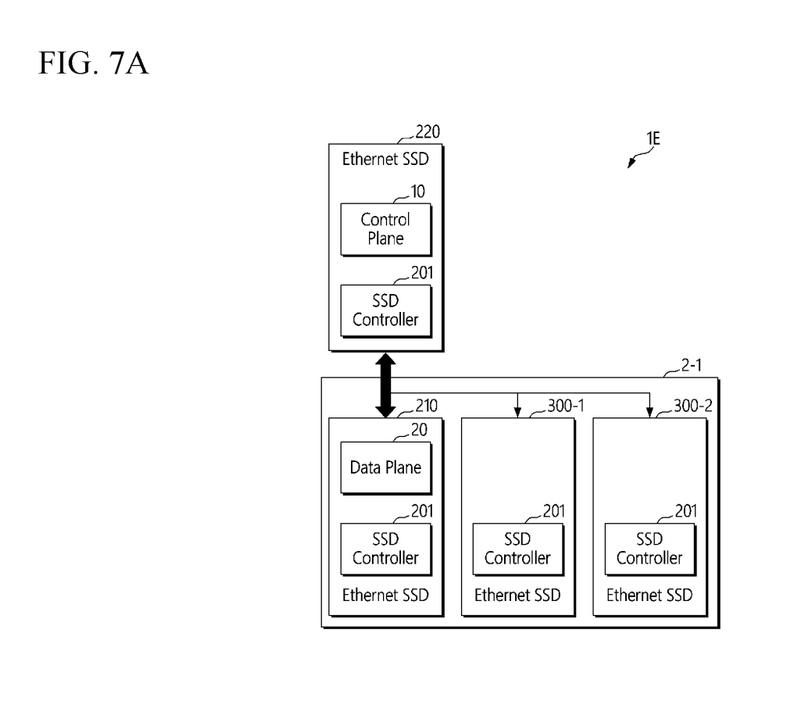

Referring to FIG. 7A, a data center 1E may include a storage device 220 and at least one storage group 2-1. The storage device 220, like its counterpart of FIG. 2B, may include a control plane 10 and may thus generate customized network connection information.

The storage group 2-1 may include a storage device 210 including a data plane 20 and common storage devices 300-1 and 300-2 not including a data plane 20.

The storage device 210 may forward data to the storage devices 300-1 and 300-2 based on received network connection information.

Figure 7B:
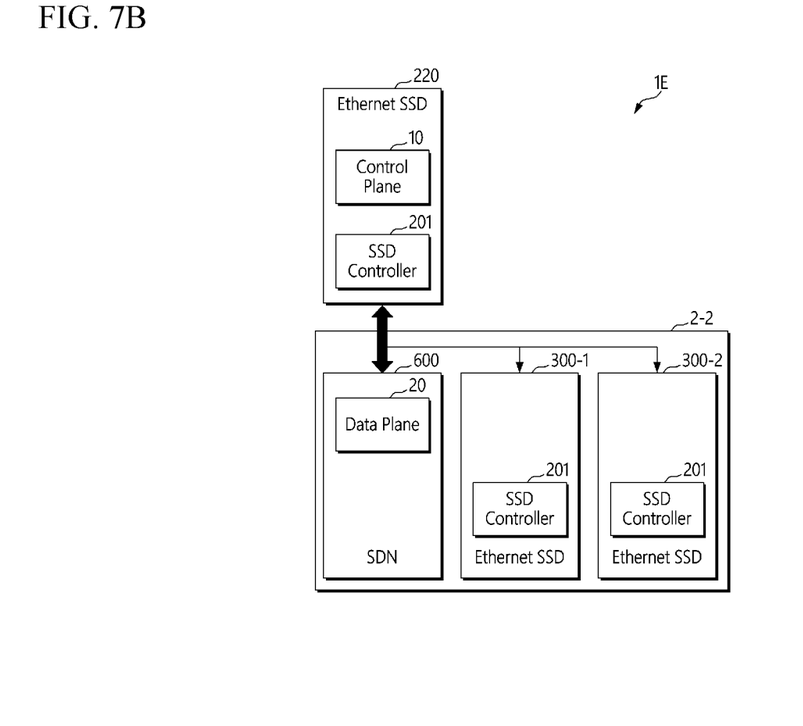

Referring to FIG. 7B, a data center 1E may include a storage device 220 and at least one storage group 2-2. In the example embodiment of FIG. 7B, unlike in the embodiment of FIG. 7A, a data plane 20 may be implemented in an SDN module 600, rather than in a storage device, and may be included in the storage group 2-2.

Figure 8A:
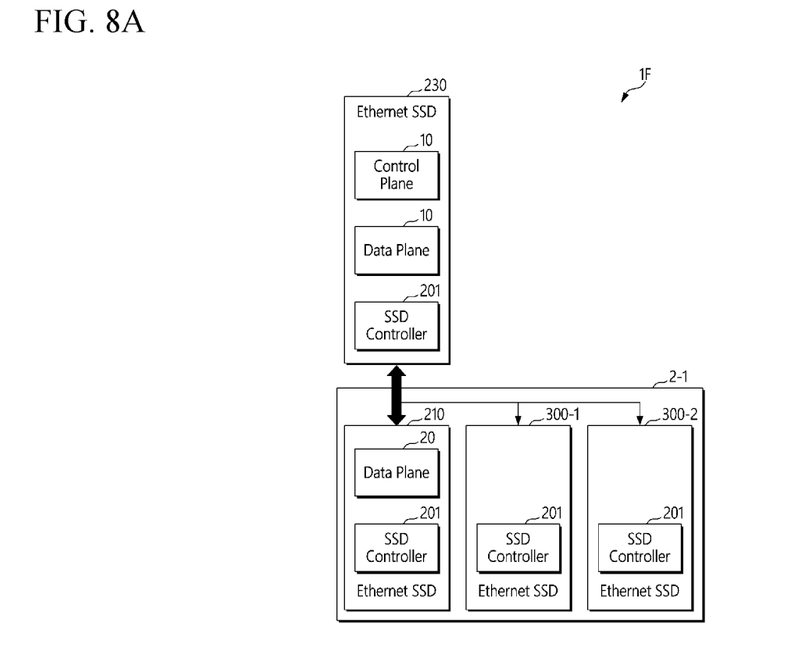

Referring to FIG. 8A, a data center 1F may include a storage device 230 and at least one storage group 2-1.

The storage device 230, like its counterpart of FIG. 2C, may include a control plane 10 and a data plane 20. The data plane 20 may transmit adaptive network connection information to the storage group 2-1. The network connection information in the data plane 20 of the storage device 230 may include data output port information of the storage group 2-1.

The storage group 2-1 may include a storage device 210 (like the storage device 210 of FIG. 2A) and common storage devices 300-1 and 300-2. Network connection information in a data plane 20 of the storage device 210 may include data output port information of the storage devices 300-1 and 300-2.

Figure 8B:
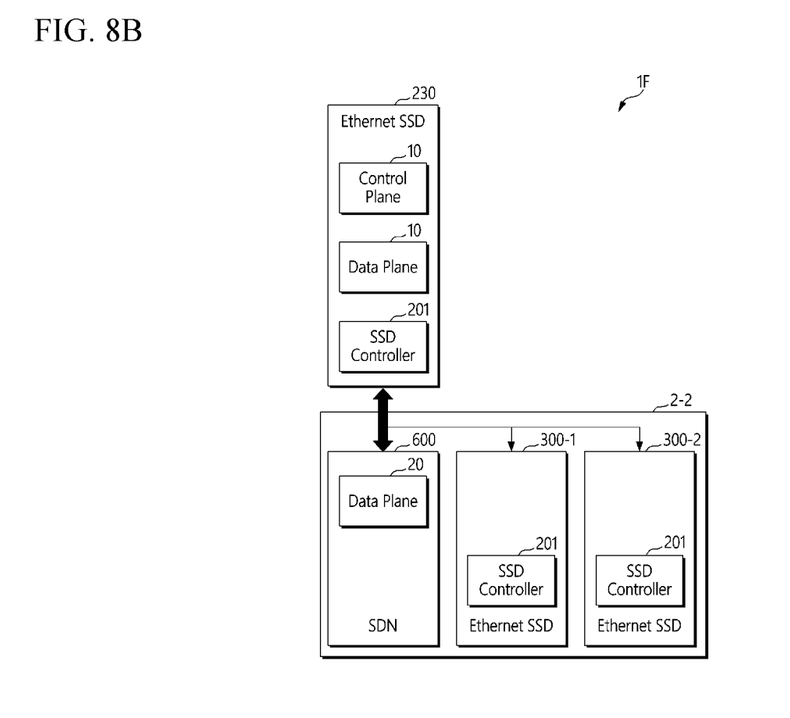

Referring to FIG. 8B, a data center 1F may include a storage device 230 and at least one storage group 2-2. In the embodiment of FIG. 8B, unlike in the embodiment of FIG. 8A, a data plane 20 in the storage group 2-2 may be implemented as an SDN module 600 separate from storage devices 300-1 and 300-2.

Figure 9:
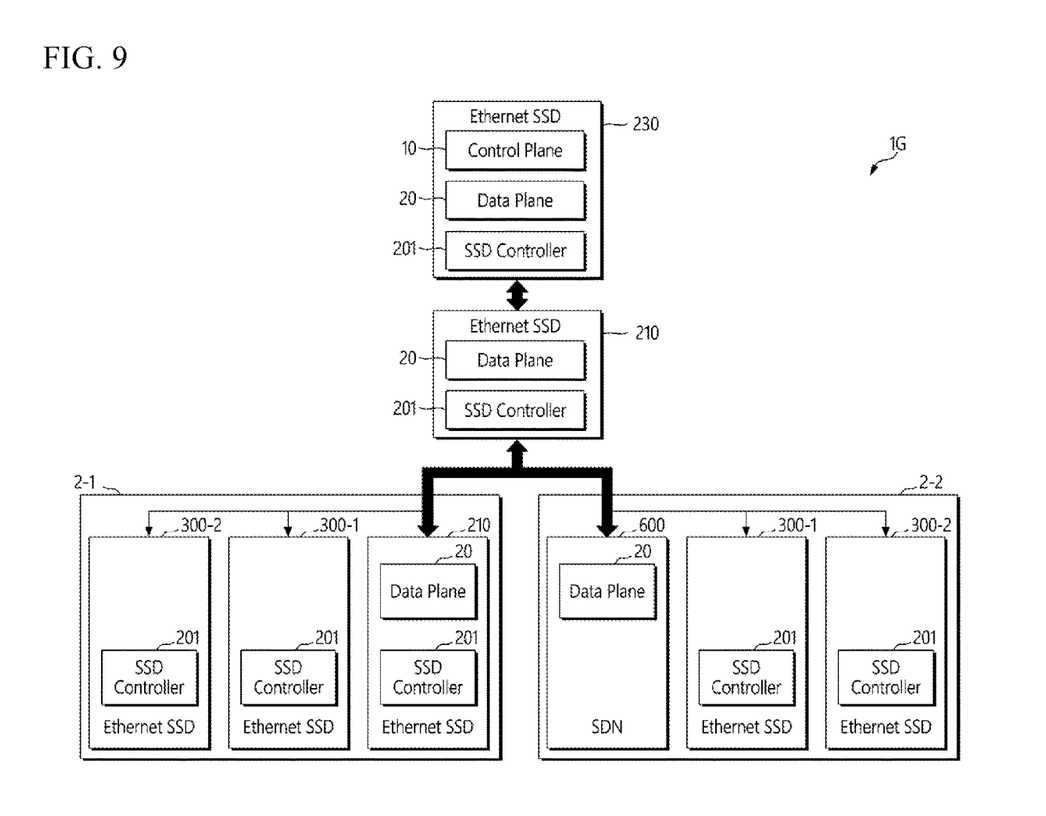

Referring to FIG. 9, a data center 1G may include a storage device 230, a storage device 210 and a plurality of storage groups 2-1 and 2-2.

An uppermost storage device 230, like the storage device 230 of FIG. 2C, may include a control plane 10.

A data plane 20 included in a storage device 210 may be an intermediate data plane 20. The intermediate data plane 20 may be a data plane 20 included in an SDN module.

A data plane 20 included in the storage device 230 may set data output port information for at least one intermediate storage device 210. The data plane 20 included in the storage device 210 may set data output port information for the storage groups 2-1 and 2-2.

The storage group 2-1 may include a storage device 210 (like the storage device 210 of FIG. 2A) and common storage devices 300-1 and 300-2. The storage group 202 may include an SDN module 600 and common storage devices 300-1 and 300-2. Although not specifically illustrated, the storage group 2-1 or 2-2 may further include one or more Ethernet-based electronic devices.

The data plane 20 included in each of the storage groups 2-1 and 2-2 may set data output port information for the common storage devices 300-1 and 300-2 that belong, and are connected, to the storage group 2-1 or 2-2.

The storage devices or the SDN modules of FIGS. 4 through 9, including a data plane, may be implemented as multiple data planes, as illustrated in FIG. 3A or 3B.

By way of summation and review, a data center may include a network device between a host device and a storage device or between systems. For example, routers or switches may be disposed between a host device and a storage device to connect the host device and the storage device. However, the management of a large network may be complicated and costly. Also, changes of physical locations or hardware may call for manual configuration, and the change of routers and/or switches may incur costs.

Software-defined networking (SDN) is a networking paradigm that disassociates the flow of data from the transmission of data and can thus form a flexible network through dynamic management and control.

As described above, embodiments relate to a data center that is connected in a software-defined networking (SDN) manner. When an SDN-based network is used in a data center, a user or administrator of the data center may set customized network connections and may thus support various services.

Embodiments may provide a data center operating as a customized network via software-defined networking (SDN). Embodiments may also provide a storage device operating as a customized network via SDN.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A data center, comprising:
 a server including a control plane to send a network connection information, the network connection information including path information, network topology information, and device orchestration information;

an Ethernet storage device including a data plane that is configured to receive the network connection information from the control plane; and a storage group including a plurality of first storage devices to receive the network connection information from the data plane, wherein the data plane is configured to set network connections between the server and the plurality of first storage devices based on the network connection information corresponding to each first storage device of the plurality of first storage devices, wherein the data plane includes a network flow table, storing mapping information between data paths and output ports, and the data plane forwards data to an output port corresponding to a data path based on the network connection information, wherein each of the plurality of first storage devices transmits or receives data according to the set network connection.

2. The data center as claimed in claim 1, wherein the data plane is included in one among the plurality of first storage devices, which is configured to transmit data to, or receive data from, another first storage device, among the plurality of first storage devices, that corresponds to the network connection information.

3. The data center as claimed in claim 2, further comprising:

an Ethernet switch connecting the storage group to the server by performing switching on the storage group, wherein:

the data plane of the Ethernet storage device is included in the storage group, and the Ethernet switch connects the data plane to the control plane.

4. The data center as claimed in claim 1, wherein the Ethernet storage device is disposed between the server and the storage group to connect the server and the storage group.

5. The data center as claimed in claim 4, wherein the storage group includes an Ethernet switch, which is connected to the data plane of the Ethernet storage device and is configured to perform switching on connections to the plurality of first storage devices.

6. The data center as claimed in claim 1, wherein the data plane is one of a plurality of data planes, which are configured to set independent connection environments based on the network connection information.

7. The data center as claimed in claim 6, wherein, when one among the plurality of data planes is unable to operate, the server and the storage group are connected in accordance with another among the plurality of data planes.

8. The data center as claimed in claim 1, wherein the plurality of first storage devices are connected by Ethernet.

9. The data center as claimed in claim 1, wherein:

the storage group further includes an electronic device, which includes an Ethernet interface and is connected to the data plane by the Ethernet interface, and the data plane is configured to transmit data to, or receive data from, the electronic device in accordance with the network connection information.

10. A data center, comprising:

a first Ethernet storage device including a control plane that is configured to set a network connection information and send the network connection information, the network connection information including path information, network topology information, and device orchestration information;

a plurality of storage groups, each including a plurality of second Ethernet storage devices; and a third Ethernet storage device including a first data plane that is configured to receive the network connection information from the control plane, wherein the first data plane adaptively sets a network connection between the control plane and each of the second Ethernet storage devices based on the network connection information, wherein the first data plane includes a network flow table, storing mapping information between data paths and output ports, and the first data plane forwards data to an output port corresponding to a data path based on the network connection information, wherein each of the plurality of second Ethernet storage devices transmits or receives data according to the set network connection.

11. The data center as claimed in claim 10, further comprising a second data plane, wherein:

the second data plane is included in the first Ethernet storage device, and the first Ethernet storage device is configured to set a network connection for the plurality of storage groups.

12. The data center as claimed in claim 11, further comprising a third Ethernet storage device including a third data plane that connects the first and second data planes.

13. The data center as claimed in claim 10, wherein the data center includes a plurality of the first data planes, each of the plurality of the first data planes being configured to set independent network connection environments based on the network connection information.

14. The data center as claimed in claim 13, wherein, when one among the plurality of first data planes is unable to operate, the first Ethernet storage device and the plurality of storage groups are connected in accordance with another among the plurality of first data planes.

15. The data center as claimed in claim 10, wherein:

the first data plane of the third Ethernet storage device is included in one among the plurality of second storage devices, and the first data plane of the third Ethernet storage device is configured to set network connections for others among the plurality of second Ethernet storage devices.

16. The data center as claimed in claim 10, wherein at least one among the plurality of storage groups further includes an electronic device that includes an Ethernet interface and is connected via the Ethernet interface based on the network connection information.

17. A data center, comprising:

a first device including a control plane that is configured to set and send network connection information, the network connection information including path information, network topology information, and device orchestration information;

a second device including a data plane that is configured to selectively forward data in accordance with the network connection information received from the control plane; and a storage group including a plurality of storage devices configured to transmit or receive data in accordance with the forwarding of data by the second device, wherein the first device and the second device are connected by Ethernet, wherein the data plane is configured to set connections between the first device and the plurality of storage devices based on the network connection information corresponding to each storage
device of the plurality of storage devices,
wherein the data plane includes a network flow table
storing mapping information between data paths and
output ports, and
the data plane forwards data to an output port corresponding to a data path based on the network connection information,
wherein each of the plurality of storage devices transmits
or receives data according to the set network connection.

18. The data center as claimed in claim 17, wherein the first device is a server or a storage device.

19. The data center as claimed in claim 17, wherein:
the second device is a first storage device among the plurality of storage devices, and
the second device is configured to control the forwarding of data to a second storage device among the plurality of storage devices.

* * * * *